(12) United States Patent
Balakrishnan et al.

(10) Patent No.: US 9,780,100 B1
(45) Date of Patent: Oct. 3, 2017

(54) VERTICAL FLOATING GATE MEMORY WITH VARIABLE CHANNEL DOPING PROFILE

(71) Applicant: INTERNATIONAL BUSINESS MACHINES CORPORATION, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/274,512

(22) Filed: Sep. 23, 2016

(51) Int. Cl.
| | |
|---|---|
| H01L 27/11521 | (2017.01) |
| H01L 29/66 | (2006.01) |
| H01L 21/02 | (2006.01) |
| H01L 21/28 | (2006.01) |
| H01L 29/10 | (2006.01) |
| H01L 29/78 | (2006.01) |
| H01L 29/788 | (2006.01) |

(Continued)

(52) U.S. Cl.
CPC .. *H01L 27/11521* (2013.01); *H01L 21/02573* (2013.01); *H01L 21/28273* (2013.01); *H01L 29/0847* (2013.01); *H01L 29/1037* (2013.01); *H01L 29/165* (2013.01); *H01L 29/66545* (2013.01); *H01L 29/66666* (2013.01); *H01L 29/66825* (2013.01); *H01L 29/788* (2013.01); *H01L 29/7827* (2013.01)

(58) Field of Classification Search
CPC ........... H01L 29/78642; H01L 29/7827; H01L 29/4925; H01L 29/66666; H01L 29/66272; H01L 29/41741; H01L 29/732; H01L 29/7371; H01L 29/0847; H01L 29/1037; H01L 29/165; H01L 29/66545; H01L 29/66825; H01L 29/788; H01L 29/7889; H01L 27/11521; H01L 27/2454; H01L 21/02573; H01L 21/3083; H01L 21/28273; H01L 21/6732
USPC ........................................................ 438/257
See application file for complete search history.

(56) References Cited

U.S. PATENT DOCUMENTS

| | | | | |
|---|---|---|---|---|
| 5,712,189 | A * | 1/1998 | Plumton | ................. H01L 21/74 117/101 |
| 6,744,083 | B2 * | 6/2004 | Chen | ..................... B82Y 10/00 257/219 |

(Continued)

*Primary Examiner* — Yasser A Abdelaziez
(74) *Attorney, Agent, or Firm* — Tutunjian & Bitetto, P.C.; Louis J. Percello

(57) ABSTRACT

A method of forming a memory device that includes forming a sacrificial gate on a surface of a first source/drain region, and forming a channel opening through the sacrificial gate. The method may further include forming an epitaxial channel region is formed in the channel opening that is in situ doped to have an opposite conductivity type as the first of the source/drain region. A second source/drain region is formed on a portion of the epitaxial channel region opposite the portion of the epitaxial channel region that the first source/drain region is present on, wherein the second source/drain region has a same conductivity type as the conductivity type of the first source/drain region. A memory gate structure including a floating gate and a control gate is substituted for the sacrificial gate.

6 Claims, 16 Drawing Sheets

(51) Int. Cl.
*H01L 29/165* (2006.01)
*H01L 29/08* (2006.01)

(56) References Cited

U.S. PATENT DOCUMENTS

| | | | |
|---|---|---|---|
| 2005/0072988 A1* | 4/2005 | Augusto | H01L 21/823885 257/192 |
| 2014/0166981 A1* | 6/2014 | Doyle | H01L 29/66666 257/24 |
| 2014/0239247 A1* | 8/2014 | Park | H01L 27/2454 257/4 |
| 2015/0014706 A1* | 1/2015 | Sadwick | H01L 29/66431 257/77 |

* cited by examiner

VERTICAL FLOATING GATE MEMORY WITH VARIABLE CHANNEL DOPING PROFILE

BACKGROUND

Technical Field

The present disclosure relates to vertically orientated memory devices, and methods of forming vertical memory devices. The methods and structures described herein integrate vertical field effect transistors with vertically orientated memory devices that include a floating gate.

Description of the Related Art

A Field Effect Transistor (FET) typically has a source, a channel, and a drain, where current flows from the source to the drain, and a gate that controls the flow of current through the channel. With ever decreasing device dimensions, forming the individual electrical components is becoming more difficult to manufacture. Vertical transistors are one means of scaling transistors to decreasing dimensions. Integration of memory devices with increasingly scaled transistors, such as vertical transistors, creates additional challenges. An approach is therefore needed that retains the positive aspects of traditional FET structures and memory devices, while overcoming the scaling issues created by forming smaller device components.

SUMMARY

In one embodiment, a method of fabricating a memory device is provided that includes forming a first portion of a channel region having a first conductivity type semiconductor material with a first dopant concentration on a source region of a second conductivity type semiconductor material; and forming a second portion of said channel region having said first conductivity type semiconductor material with a second dopant concentration greater than the first dopant concentration. A drain region of the second conductivity type is then formed on the second portion of the channel region, wherein the source region, channel region and drain region are orientated vertically relative to a supporting substrate that the source region is present on. A memory gate structure is then formed around the channel region including a floating gate structure and a control gate structure.

In another embodiment, a method of fabricating a memory device is provided that includes forming a sacrificial gate on a surface of a first source/drain region; and forming a channel opening through the sacrificial gate. An epitaxial channel region is formed in the channel opening that is in situ doped to have an opposite conductivity type as the first of the source/drain region. In some embodiments, the epitaxial channel region has a uniform dopant concentration of a single conductivity type. In other embodiments, the epitaxial channel region has a modulated dopant concentration of a single conductivity type, in which a lower dopant concentration portion of the epitaxial channel region is present at an interface with the first source/drain region. A second source/drain region is formed on a portion of the epitaxial channel region opposite the portion of the epitaxial channel region that the first source/drain region is present on. The second source/drain region has a conductivity type that is the same as the conductivity type of the first source/drain region. In some embodiments, the second source/drain region is composed of a semiconductor material having an energy gap that is smaller than the energy gap of the epitaxial channel. Following forming the drain region, a memory gate structure including a floating gate and a control gate is substituted for the sacrificial gate.

In another aspect, a memory device is provided that includes a source region and a drain region of a first conductivity type having an epitaxial channel region present therebetween, wherein the source region, the drain region and the epitaxial channel region are orientated vertically, and the epitaxial channel region comprises a modulated dopant concentration having a higher concentration at an interface between the epitaxial channel region and the drain region. The memory device may further include a memory gate structure including a floating gate and a control gate.

In another embodiment, a memory device is provided that includes a source region and drain regions of a first conductivity type having an epitaxial channel region present therebetween, wherein the source region, drain region and epitaxial channel region are orientated vertically, wherein a semiconductor material of the drain region has a smaller energy band gap than the epitaxial channel region. The memory device may further include a memory gate structure including a floating gate and a control gate.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
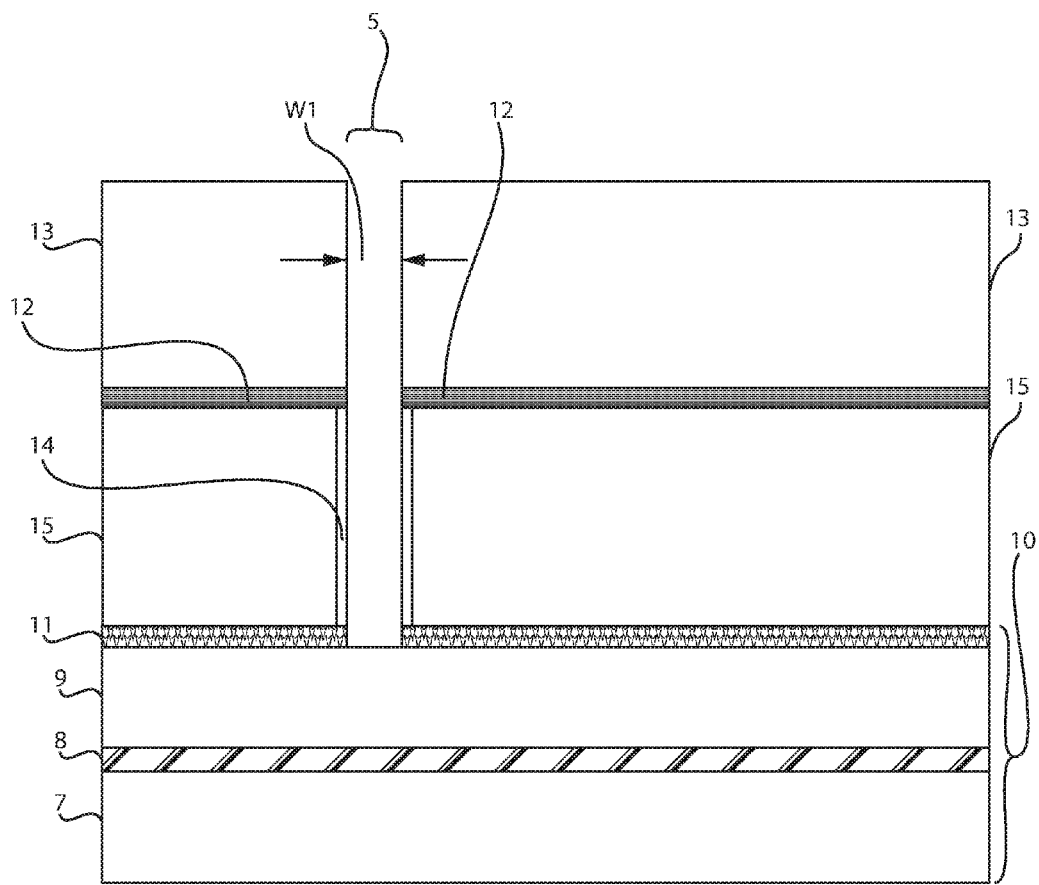
FIG. 1 is a side cross-sectional view depicting one embodiment of forming a channel opening through a sacrificial gate layer to expose a surface of a source region layer of a material stack, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Vertical transistors are an attractive option for technology scaling for 5 nm and beyond. Further, there is an interest in integrating floating gate memory cells, which form the basis of non-volatile memories, such as flash, PROM, EPRPOM and EEPROM, with vertical devices.

A "memory device" is a structure in which the electrical state of which can be altered and then retained in the altered state; in this way a bit of information, i.e., "1" or "0", can be stored. An EPROM (rarely EROM), or erasable programmable read-only memory, is a type of memory chip that retains its data when its power supply is switched off. Computer memory that can retrieve stored data after a power supply has been turned off and back on is called non-volatile. It is an array of floating-gate transistors individually programmed by an electronic device that supplies higher voltages than those normally used in digital circuits. In some embodiments, once programmed, an EPROM can be erased by exposing it to strong ultraviolet light source (such as from a mercury-vapor light).

As used herein, the term "floating gate" denotes a gate structure in which a dielectric surrounds a floating gate conductor, substantially in its entirely, so charge is stored on the floating gate, wherein the charge stored on the floating gate can be modified by applying voltages to the source, drain, and control gate. As used herein, the term "control gate" denotes the gate conductor overlying the floating gate, but separated from the floating gate by a dielectric layer. A "floating gate structure" is a floating gate conductor and the corresponding gate dielectric. When a voltage is applied to the control gate, the control gate voltage is capacitively coupled to the floating gate, which in turn capacitively couples to the device channel region, thus changing the conductance of the device channel region. In one embodiment, the first conductivity type is p-type and the second conductivity type is n-type, the device is an n-channel FET. Hot electrons are injected from the device channel region into the floating gate when both the gate voltage and the drain voltage are large and positive relative to the source. The electrons thus injected into the floating gate reduce the device channel conductance. The efficiency of hot electron injection from the channel region into the floating gate is increased when the doping concentration in the channel near the drain is increased. In another embodiment, the first conductivity type is n-type and the second conductivity type is p-type, the device is a p-channel FET. Hot electrons are injected from the device channel region into the floating gate when gate voltage is the same as the source voltage and the drain voltage is large and negative relative to the source. The electrons thus injected into the floating gate increase the device channel conductance. The efficiency of hot electron injection from the channel region into the floating gate is increased when the doping concentration in the channel near the drain is increased.

As will be discussed herein, vertical transistors may be integrated with the vertical memory devices that are described herein. In some examples, the vertical transistors may be vertical FinFETs. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel of the fin structure A FinFET is a semiconductor device that positions the channel region of the semiconductor device in a fin structure. The source and drain regions of the fin structure are the portions of the fin structure that are on opposing sides of the channel region of the fin structure.

In an embodiment, a FinFET semiconductor device has the drain, fin channel, and source device components arranged perpendicular to the plane of the substrate surface, which is referred to as a vertical stack. A vertically stacked FinFET can have a longer gate length (i.e., height) and larger dielectric spacer than a horizontal (i.e., having the drain, fin channel, and source device components arranged parallel with the plane of the substrate surface) FinFET having comparable contact gate pitch.

The methods and structures described herein provide a channel-last replacement metal-gate gate all-around vertical memory and transistor device flow. In accordance with some embodiments of the described methods and structures, an EPROM device is formed using a process which is compatible with a channel-last RMG gate all-around vertical transistor flow. In some embodiments, in order to increase the hot carrier injection efficiency to increase avalanche multiplication, and thereby reduce the operating voltage, the channel doping is modulated near the drain of the memory device. By modulated it is meant that at least two doping regions are present of the same conductivity type, wherein a first of the doping regions has a greater doping concentration than a second adjacent doping region. The dopant concentration of the modulated channel is greater at the interface of the channel and the drain region relative to the dopant concentration of the channel at the interface with the source region of the memory device. This increases the programming efficiency of the cell. In other embodiments, the drain region of the device may have a smaller energy gap than the channel region of the device, which decreases drain junction breakdown voltage, and therefore can increase drain region avalanche multiplication. In yet another embodiment, the doping level of the channel region of the device is increased uniformly. As will be discussed in greater detail below, the characteristics of the channel-last process flow allow for fine-tuning of doping concentration throughout the channel region in a controllable manner, e.g., by using step by step epitaxial growth and in situ doping. The methods and structures of the present disclosure are now discussed with more detail referring to FIGS. 1-16.

FIG. 1 depicts one embodiment of forming a channel opening 5 through a dummy gate layer 15 to expose a surface of a source region layer 9 of a material stack 10 for forming a memory device. The material stack 10 may include a supporting substrate 7 that the source region layer 9 may be formed on. The supporting substrate 7 may be a bulk semiconductor substrate. For example, the bulk semiconductor substrate may be composed of a type IV semiconductor, such as silicon, silicon germanium and/or germanium. The bulk semiconductor substrate may also be composed of a type III-V semiconductor material. In some examples, described herein, the supporting substrate is composed of silicon (Si). Although the supporting substrate 7 is depicted as being a bulk substrate, in some other examples, the supporting substrate 7 may also be provided by a semiconductor, e.g., silicon, on insulator (SOI) substrate.

The source region layer 9 may be formed on the supporting substrate 7 using an epitaxial deposition process. "Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface will take on a {100} orientation. The epitaxial deposition process may be carried out in the deposition chamber of a chemical vapor deposition (CVD) apparatus.

In some embodiments, the epitaxial semiconductor material that provides the source region layer 9 may be composed of silicon. Examples of silicon gas source for epitaxial deposition of the source region layer 9 may be selected from the group consisting of hexachlorodisilane ($Si_2Cl_6$), tetrachlorosilane ($SiCl_4$), dichlorosilane ($Cl_2SiH_2$), trichlorosilane ($Cl_3SiH$), and combinations thereof. In some embodiments, the epitaxial semiconductor material that provides the source region layer 9 may be composed of germanium. Examples of germanium gas source for epitaxial deposition may be selected from the group consisting of germane ($GeH_4$), digermane ($Ge_2H_6$), halogermane, dichlorogermane, trichlorogermane, tetrachlorogermane and combinations thereof.

In various embodiments, the source region layer 9 may have a thickness in the range of about 10 nm to about 250 nm, or about 20 nm to about 150 nm, or about 50 nm to about 100 nm.

The epitaxial semiconductor material that provides the source region layer 9 may be doped to an n-type or p-type conductivity. As used herein, the term "conductivity type" describes whether a semiconductor material has a p-type or n-type conductivity. For example, a first conductivity type may be "n-type", and a second conductivity type may be "p-type", and vice versa. As used herein, "p-type" refers to the addition of impurities to an intrinsic semiconductor that creates deficiencies of valence electrons. In a type IV semiconductor material, such as silicon and germanium, examples of p-type dopants, i.e., impurities, include but are not limited to: boron, aluminum, gallium and indium. As used herein, "n-type" refers to the addition of impurities that contributes free electrons to an intrinsic semiconductor. In a type IV semiconductor material, such as silicon or germanium, examples of n-type dopants, i.e., impurities, include but are not limited to antimony, arsenic and phosphorous. In some embodiments, when forming the devices depicted in FIGS. 13-14, the conductivity type of the source region layer 9 may be n-type. In some other embodiments, when forming the devices depicted in FIGS. 15 and 16, the conductivity type of the source region layer 9 may be p-type.

The dopant for the source region layer 9 may be introduced in-situ during the formation of the base material, i.e., epitaxial semiconductor material, of the source region layer 9. The dopant for the source region layer 9 may be at a high concentration relative to the subsequently formed channel region, and therefore may be designated "n+" or "p+" dependent upon the conductivity type. For example, the concentration of dopant in the source region layer 9 may range from $1\times10^{20}$ $cm^{-3}$ to $1\times10^{21}$ $cm^{-3}$.

The n-type gas dopant source for in-situ doping may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine ((CH,)3P), dimethylphosphine ((CH$_3$)$_2$PH), triethylphosphine ((CH$_3$CH$_2$)$_3$P) and diethylphosphine ((CH$_3$CH$_2$)$_2$PH). The p-type gas dopant source for in-situ doping may include diborane. In other embodiments, the source region layer 9 may also be formed using gas phase doping or ion implantation.

In some embodiments, a counter-doped layer 8 may be present between the source region layer 9 and the underlying supporting substrate 7, e.g., bulk semiconductor substrate. The counter-doped layer 8 may have an opposite conductivity type as the source region layer 9. For example, when the source region layer 9 is doped to an n-type conductivity type, the counter-doped layer 8 is doped to a p-type conductivity type, and vice versa. The counter-doped layer 8 may be composed of a same base material composition or a different base material composition as the source region layer 9. In some embodiments, the counter doped layer 8 can be composed of a silicon containing material, such as silicon or silicon germanium, and the counter doped layer 8 can be epitaxially formed on the supporting substrate 7. In one example, the counter doped layer 9 is epitaxially formed on the supporting substrate 7 using an epitaxial deposition sequence that first forms the counter doped layer 9 having a first conductivity type dopant followed by changing the conductivity type after forming the counter doped layer 9 to provide the source region layer 9. Counter doped layer doping level $1 \times 10^{18}$ cm$^{-3}$ to $3 \times 10^{19}$ cm$^{-3}$ Still referring to FIG. 1, a first dielectric spacer layer 11 on the source region layer 9. The first dielectric spacer layer 11 may be referred to as a bottom dielectric layer. The first dielectric spacer layer 11 may be deposited to provide the spacer between the source region of the device, which is provided by the source region layer 9, and the subsequently formed functional gate structure. The first dielectric spacer layer 11 can be composed of an oxide, nitride, or oxynitride material. In some embodiments, the first dielectric spacer layer 11 may be composed of a low-k dielectric material. As used herein, the term "low-k" denotes a dielectric material having a dielectric constant equal to the dielectric constant of silicon oxide (SiO$_2$) or less. The low-k dielectric spacers typically have a dielectric constant that is less than 7.0, e.g., 5.5. In one embodiment, the first dielectric spacer layer 11 is composed of a low-k dielectric layer having a dielectric constant ranging from 3.9 to 6. In another embodiment, the first dielectric spacer layer 11 is composed of a low-k dielectric material that has a dielectric constant less than 3.9. Examples of materials suitable for the low-k dielectric material include diamond like carbon (DLC), organosilicate glass (OSG), fluorine doped silicon dioxide, carbon doped silicon dioxide, carbon doped silicon nitride, porous silicon dioxide, porous carbon doped silicon dioxide, boron doped silicon nitride, spin-on organic polymeric dielectrics (e.g., SILK™), spin-on silicone based polymeric dielectric (e.g., hydrogen silsesquioxane (HSQ) and methylsilsesquioxane (MSQ), and combinations thereof. It is noted that the above materials are provided for illustrative purposes only, and are not intended to limit the present disclosure. In some examples, the second dielectric layer 12 may be composed of silicon nitride. The first dielectric spacer layer 11 may be deposited using at least one of spin on deposition, chemical vapor deposition (CVD), plasma-assisted CVD, evaporation and chemical solution deposition.

A layer of sacrificial gate material 15 may be formed atop the first dielectric spacer layer 11. The layer of sacrificial gate material 15 has a geometry that contributes to the shape of the later formed functional gate structure. In a replacement gate process flow, a replacement gate structure, which may also be referred to as a sacrificial gate structure, is formed first followed by a number of processing steps for forming structures within a semiconductor device. In the present case, the source region is formed prior to the sacrificial gate material 15, in which the sacrificial gate material 15 is deposited and patterned to provide a channel opening 5. Thereafter, a channel region 20, 25 is formed within the channel opening 5, while the layer of sacrificial gate material 15 still remains. Additionally, the drain region 35 is formed opposite the source region on the channel region 20, 25, in which the layer of sacrificial gate material 15 is still present surrounding the channel region 20, 25. Thereafter, the layer of sacrificial gate material 15 is substituted with a functional gate structure, as will be described in greater detail below.

In some embodiments, the sacrificial gate material 15 is composed of semiconductor material, but it is noted that any material that can be removed selectively to at least the subsequently formed channel region, and first dielectric spacer layer 11 can be suitable for the sacrificial gate material 15. In some embodiments, the sacrificial gate material 15 may be composed of a silicon containing material, such as amorphous silicon ($\alpha$-Si). The sacrificial gate material 15 may be deposited using chemical vapor deposition (CVD), such as plasma enhanced chemical vapor deposition (PECVD), metal organic chemical vapor deposition (MOCVD) or combinations thereof. The thickness of the sacrificial gate material 15, as well as the thickness of the first dielectric spacer layer 11 and the thickness of the subsequently described second dielectric spacer layer 12 contribute to the channel length. In some embodiments, the thickness of the sacrificial gate material 15 may range from 5 nm to 200 nm. In another embodiment, the thickness of the sacrificial gate material may range from 10 nm to 100 nm.

The second dielectric spacer layer 12 may be formed atop the sacrificial gate material 15. The second dielectric spacer layer 12 may be referred to as the top spacer layer. The second dielectric layer 12 is similar to the above described first dielectric spacer layer 12. Therefore, the above description of the first dielectric spacer layer 11 is suitable for describing at least one example of the second dielectric spacer layer 12. For example, the second dielectric spacer layer 12 may be composed of a low-k dielectric, but it is not necessary that the second dielectric spacer layer be composed of one of the aforementioned materials. For example, the second dielectric spacer layer 12 may be composed of any oxide, nitride or oxynitride layer, so long as the material selected maintains the etch selectively required for the following described process flow. In some examples, the second spacer dielectric layer 12 may be composed of silicon nitride. The second dielectric layer 12 can have the same composition or different composition as the above described first dielectric spacer layer 11. The second dielectric spacer layer 12 may be deposited using at least one of spin on deposition, chemical vapor deposition (CVD), plasma-assisted CVD, evaporation and chemical solution deposition.

In some embodiments, following the formation of the second dielectric layer 12, a masking dielectric layer 13 may be formed. The masking dielectric layer 13 may be composed of an oxide, nitride or oxynitride containing dielectric, which can be deposited using chemical vapor deposition. The composition of the masking dielectric layer 13 can be any material that can provide for a masking function as part of the pattern and etch processes used to form the subsequently described channel opening 5. For example, the masking dielectric layer 13 may be silicon oxide, when the underlying second dielectric spacer layer 12 is a nitride. The thickness of the masking dielectric layer 13 may be selected to provide that a long enough channel region can be formed in the channel region opening 5 that is subsequently formed through the masking dielectric layer 13 while providing enough excess semiconductor material following removal of the masking dielectric layer 13 to provide an epitaxial deposition site for the drain region of the device.

Referring to FIG. 1, in some embodiments, a channel region opening 5 may then be formed through the masking dielectric layer 13, the second dielectric spacer layer 12, the sacrificial gate structure material 15, and the first dielectric spacer layer 11 to expose a surface of the source region layer 9. The exposed surface of the source region layer 9 may provide the epitaxial growth surface for forming the channel region of the device, as will be discussed with reference to FIG. 2.

The channel region opening 5 may be formed using photolithography and etching. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. Following formation of the patterned photoresist (also referred to as a photoresist etch mask), the exposed portions the masking dielectric layer 13, and the underlying portions of the second dielectric spacer layer 12, the sacrificial gate structure material 15, and the first dielectric spacer layer 11 are etched to expose the surface of the source region layer 9. The etch process may be anisotropic, and in its final steps can be selective to the semiconductor material of the source region layer 9. For example, the etch process for forming the channel region opening 5 is a reactive ion etch (RIE) process.

As noted above, in some embodiments, the width W1 of the channel region opening 5 dictates the width of the later formed epitaxially formed semiconductor channel material for the device, e.g., fin structure that provides the channel region of the device. In one embodiment, the width W1 of the channel region opening 5 may be less than 20 nm. In some other embodiments, the width W1 of the channel region opening 5 may range from 3 nm to 8 nm.

FIG. 1 also depicts one embodiment of forming an inner spacer 14 on at least the sidewalls of the channel region opening 5. The inner spacer 14 may be formed using thermal oxidation. For example, the inner spacer 14 may be composed of silicon oxide, and may be formed using plasma oxidation. The inner spacer 14 is only formed on the sidewalls of the sacrificial gate material 15, but is not formed on the exposed surface of the source region layer 9. In some embodiments, the inner spacer 14 is formed before the etch process for the channel opening 5 cuts through the first dielectric spacer layer 11.

Figure 2:
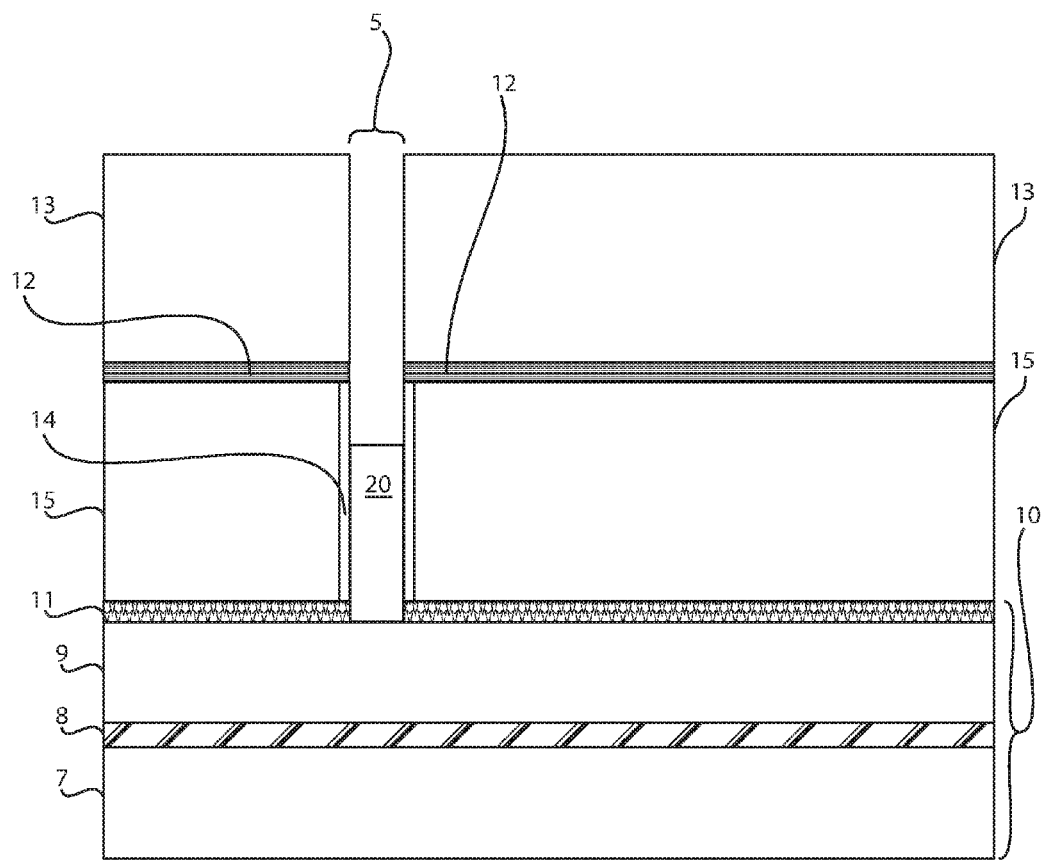
FIG. 2 is a side cross-sectional view depicting one embodiment of forming a first in situ doped epitaxial semiconductor material for the channel region of the device, in which the first in situ doped epitaxial semiconductor material is doped to a first conductivity type and has a first dopant concentration, in accordance with the present disclosure.

FIG. 2 depicts one embodiment of forming a first in situ doped epitaxial semiconductor material 20 for the channel region of the device, in which the first in situ doped epitaxial semiconductor material 20 is doped to a first conductivity type and has a first dopant concentration. The first conductivity type of the first in situ doped epitaxial semiconductor material 20 is typically opposite the conductivity type of the source region layer 9. For example, when the source region layer 9 is n-type, the first in situ doped epitaxial semiconductor material 20 may be p-type.

The first in situ doped epitaxial semiconductor material 20 is formed using an epitaxial deposition process that employs the exposed semiconductor surface of the source region layer 9 for the growth, i.e., deposition, surface. The epitaxial deposition process employed for the first in situ doped epitaxial semiconductor material 20 has been described above for epitaxially forming the source region layer 9. Because the epitaxial deposition process for forming the first in situ doped epitaxial semiconductor material 20 is similar to the epitaxial deposition process that forms the source region layer 9, the above described process limitations for epitaxially forming the source region layer 9 are applicable to the epitaxial deposition process for forming the first in situ doped epitaxial semiconductor material 20.

In some embodiments, the first in situ doped epitaxial semiconductor material 20 may be composed of a silicon containing semiconductor, such as silicon (Si). Other semiconductor materials are equally applicable to the first in situ doped epitaxial semiconductor material, such as germanium containing semiconductors, e.g., silicon germanium and germanium, as well as other type IV semiconductor materials. The first in situ doped epitaxial semiconductor material 20 may also be composed of type III-V semiconductors, such as gallium arsenic (GaAs) containing semiconductors. The crystalline structure of the first in situ doped epitaxial semiconductor material is typically substantially the same as the crystalline structure of the source region layer 9. For example, if the source region layer 9 is single crystal/monocrystalline, the first in situ doped epitaxial semiconductor material is single crystal/monocrystalline.

The first in situ doped epitaxial semiconductor material 20 fills at least half the height of the channel region opening 15 in the sacrificial gate material 15. The height of the first in situ doped epitaxial semiconductor material 20 can be between ½ and ¾ the height of the channel region opening 15. The height of the growth for the first in situ doped epitaxial semiconductor material can be selected to provide for some space within the channel region opening 15 for epitaxial growth of the later described second in situ doped epitaxial semiconductor material 25.

The dopant that dictates the conductivity type of the first in situ doped epitaxial semiconductor material is introduced during the materials formation by in situ doping, and is present in a dopant concentration that can be referred to as being moderate. For example, the dopant concentration is selected to be at a level that is less than the dopant concentration of the later formed second in situ doped epitaxial semiconductor material 25. In some embodiments, the doping concentration of the p-type, or n-type dopant, may range from $5 \times 10^{17}$ cm$^{-3}$ to $5 \times 10^{18}$ cm$^{-3}$. In one example, the doping concentration of the p-type or n-type dopant may be equal to $1 \times 10^{18}$ cm$^{3}$.

Figure 13:
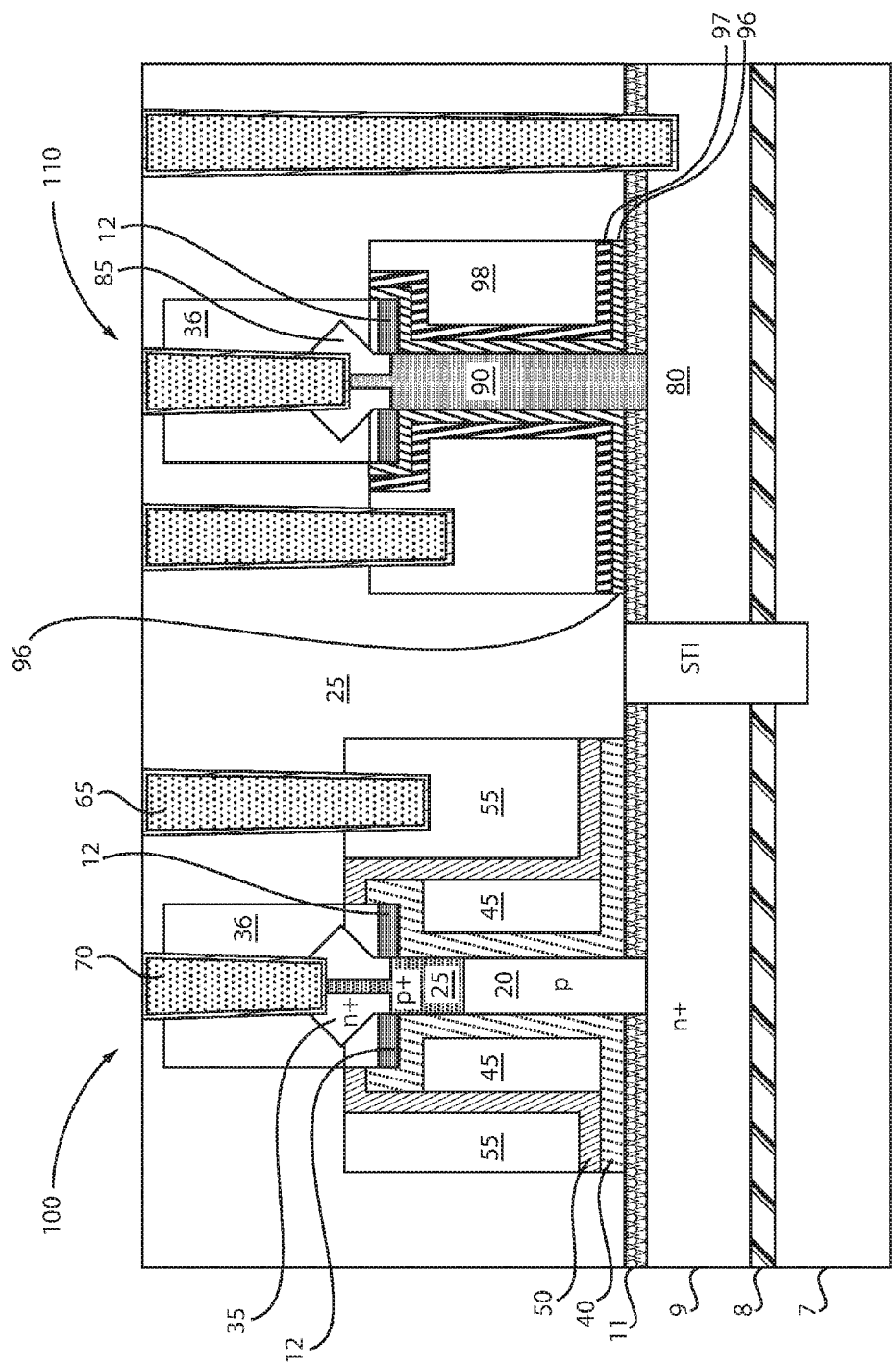
FIG. 13 is a side cross-sectional view depicting forming a memory device including a floating gate and a p-type doped channel that is formed in accordance with the method described with reference to FIGS. 1-12 in combination with a vertical transistor.
Figure 14:
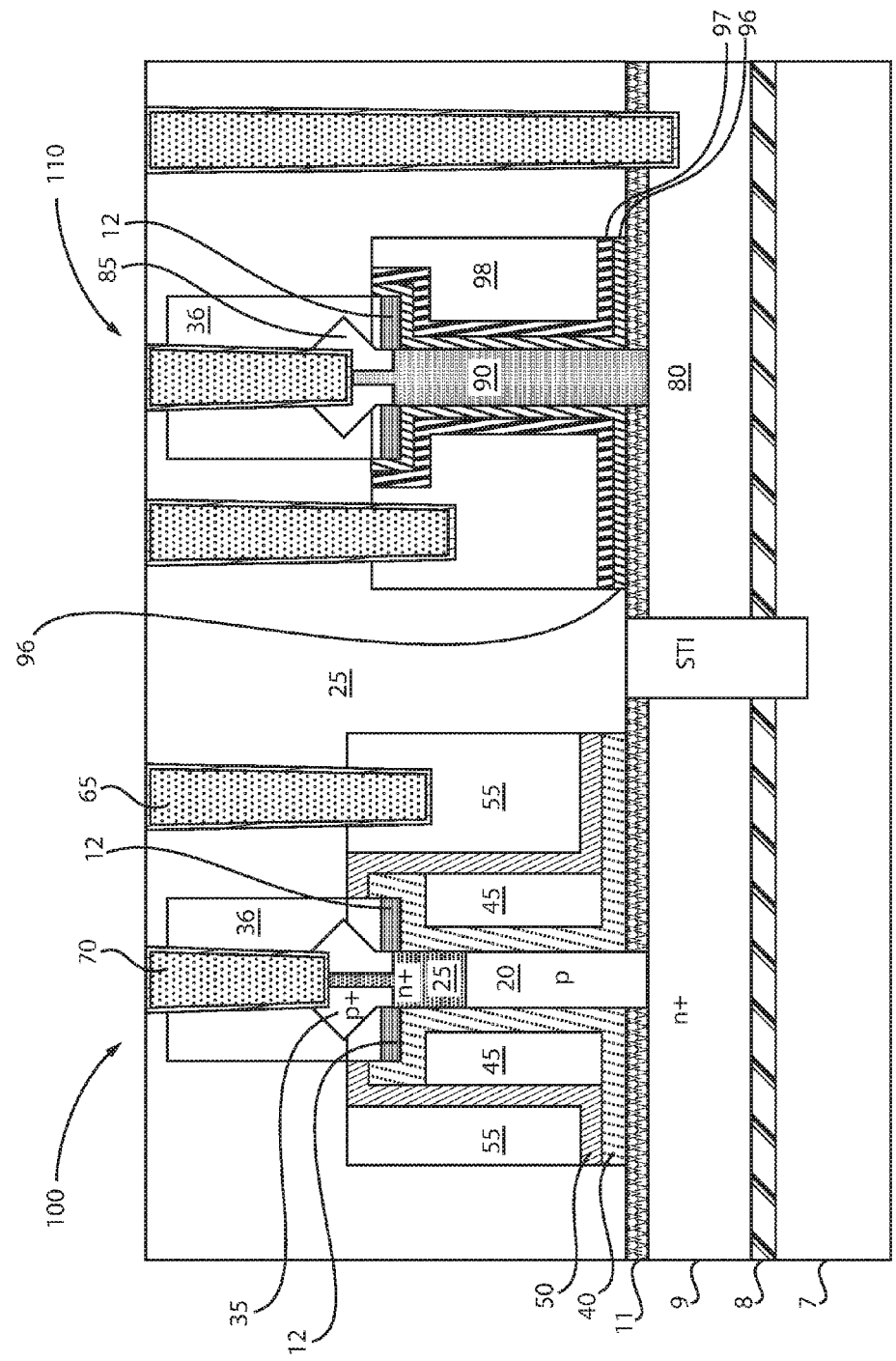
FIG. 14 is a side cross-sectional view depicting forming a memory device including a floating gate and an n-type doped channel that is formed in accordance with the method described with reference to FIGS. 1-12 in combination with a vertical transistor.
Figure 15:
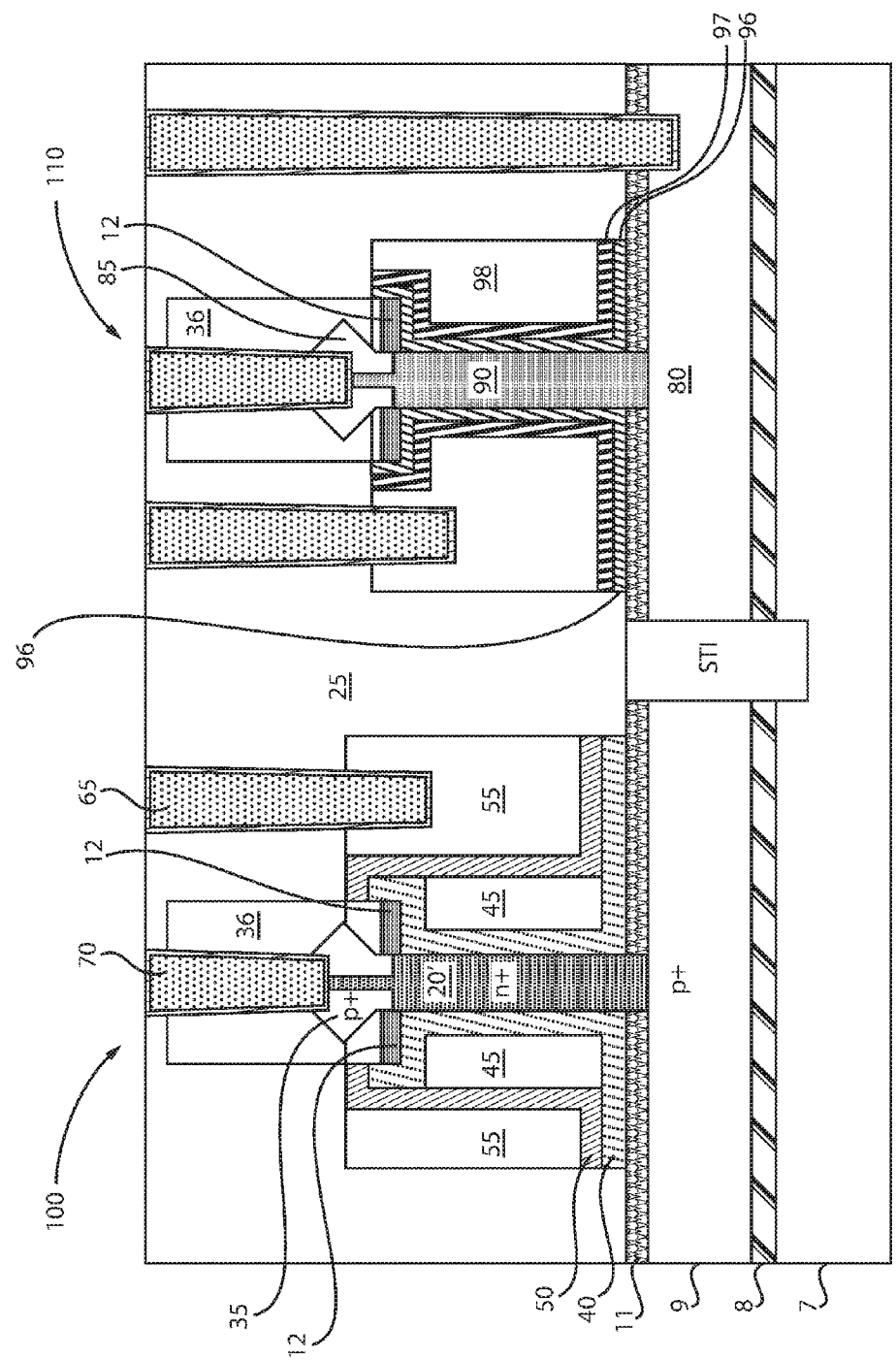
FIG. 15 is a side cross-sectional view depicting forming a memory device including a floating gate and a uniformly doped channel in combination with a vertical transistor.
Figure 16:
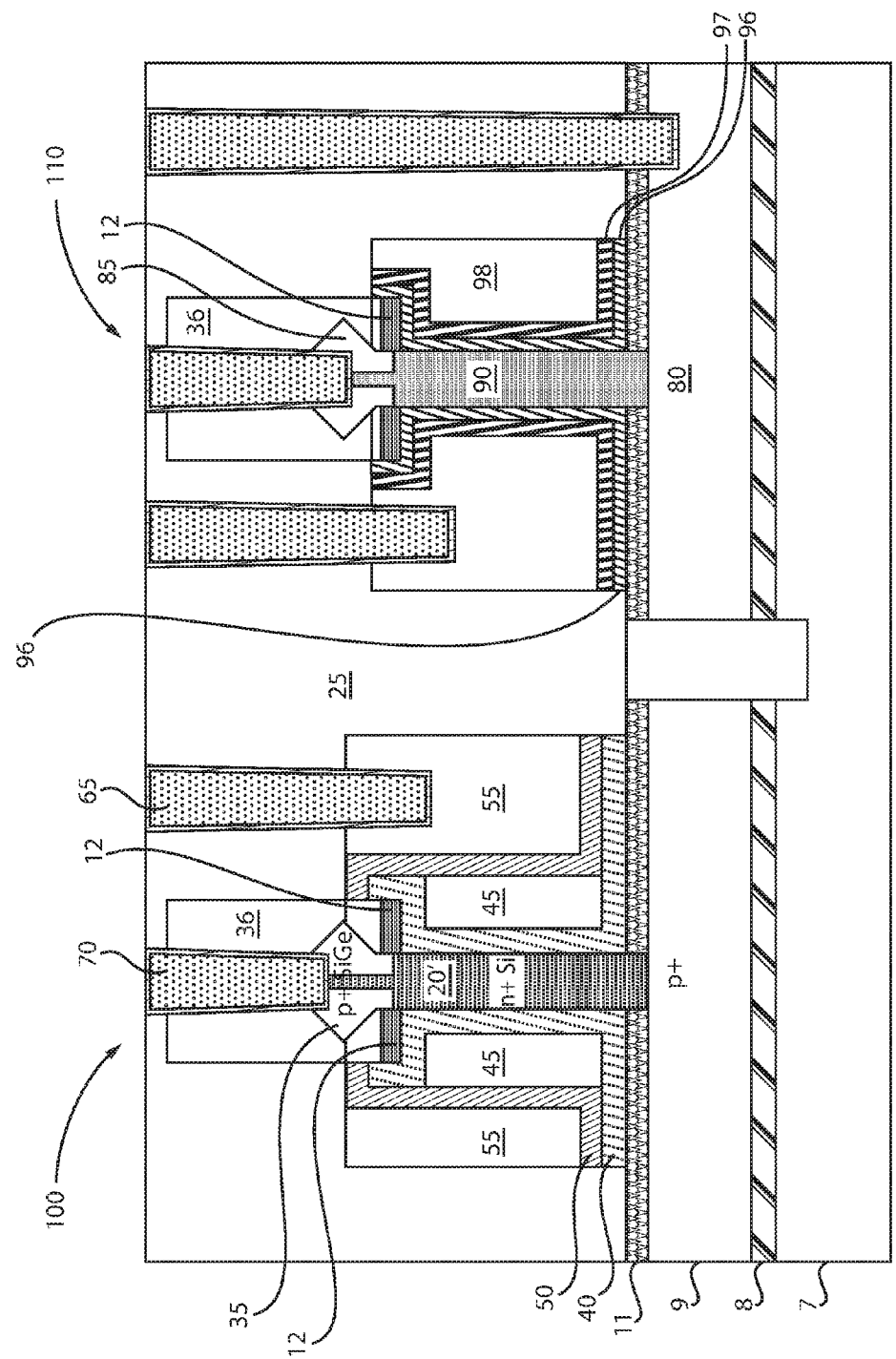
FIG. 16 is a side cross-sectional view depicting forming a memory device including a floating gate and a drain region comprised of a narrow band gap semiconductor material in combination with a vertical transistor.

In some embodiments, as depicted in FIGS. 13 and 14, the first conductivity type that provides the dopant type for the first in situ doped epitaxial semiconductor material 20 is p-type. In some other embodiments, as depicted in FIGS. 15 and 16, the first conductivity type that provides the dopant type for the first in situ doped epitaxial semiconductor material 20 is n-type.

Figure 3:
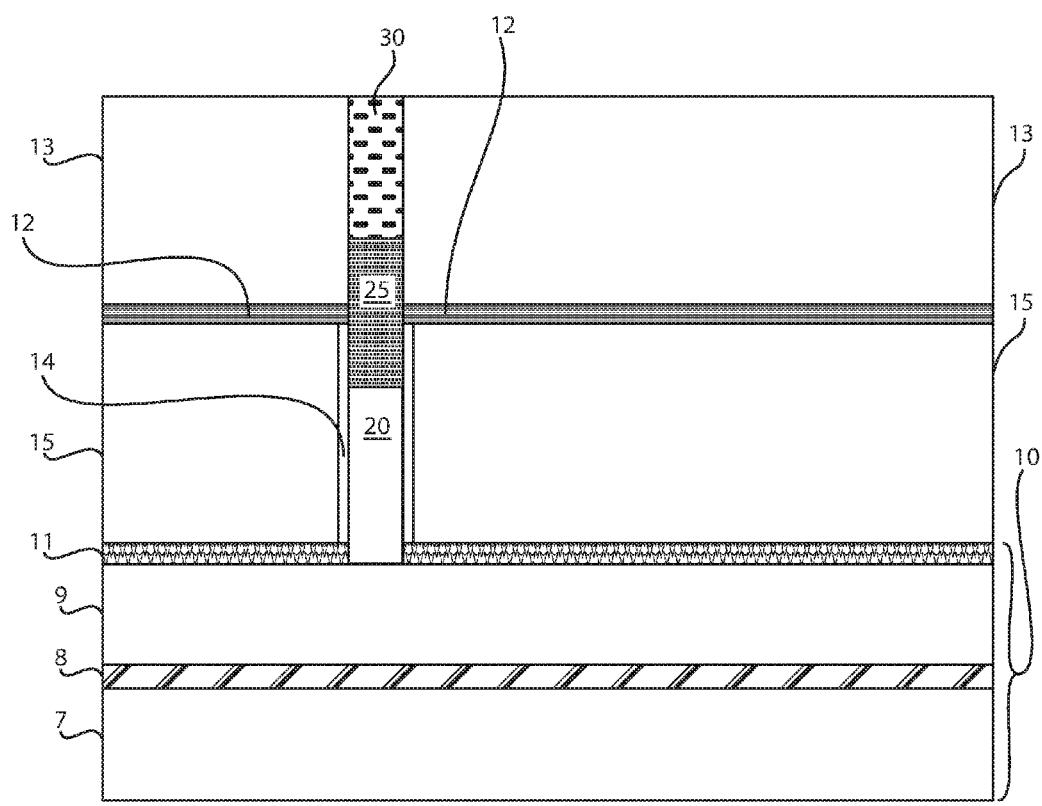
FIG. 3 is a side cross-sectional view depicting one embodiment of forming a second in situ doped epitaxial semiconductor material for the channel region of the device, in which the second in situ doped epitaxial semiconductor material is doped to the first conductivity type and has a second dopant concentration, in accordance with the present disclosure.

FIG. 3 depicts one embodiment of forming a second in situ doped epitaxial semiconductor material 25 for the channel region of the device. In some embodiments, the second in situ doped epitaxial semiconductor material 25 is doped to the first conductivity type and has a second dopant concentration. In some embodiments, the first conductivity type of the second in situ doped epitaxial semiconductor material 25 is the same as the conductivity type as the first in situ doped epitaxial semiconductor material 20. For example, when the first in situ doped epitaxial semiconductor material is n-type, the second in situ doped epitaxial semiconductor material is also n-type; and when the first in situ doped epitaxial semiconductor material is p-type, the second in situ doped epitaxial semiconductor material is also p-type.

The second in situ doped epitaxial semiconductor material 25 is formed using an epitaxial deposition process that employs the upper surface of the first in situ doped epitaxial semiconductor material 20 for the growth, i.e., deposition, surface. The epitaxial deposition process employed for the second in situ doped epitaxial semiconductor material 25 has been described above for epitaxially forming the source region layer 9 and the first in situ doped epitaxial semiconductor material 20. Because the epitaxial deposition process for forming the second in situ doped epitaxial semiconductor material 25 is similar to the epitaxial deposition process that forms the source region layer 9 and the first in situ doped epitaxial semiconductor material 20, the above described process limitations for epitaxially forming the source region layer 9 and the first in situ doped epitaxial semiconductor material 20 are applicable to the epitaxial deposition process for forming the second in situ doped epitaxial semiconductor material 25.

In some embodiments, the second in situ doped epitaxial semiconductor material 25 may be composed of a silicon containing semiconductor, such as silicon (Si). Other semiconductor materials are equally applicable to the second in situ doped epitaxial semiconductor material 25, such as germanium containing semiconductors, e.g., silicon germanium and germanium, as well as other type IV semiconductor materials. The second in situ doped epitaxial semiconductor material 25 may also be composed of type III-V semiconductors, such as gallium arsenic (GaAs) containing semiconductors. The crystalline structure of the second in situ doped epitaxial semiconductor material 25 is typically substantially the same as the crystalline structure of the first in situ doped epitaxial semiconductor material 20. For example, if the first epitaxial semiconductor material 20 is single crystal/monocrystalline, the second in situ doped epitaxial semiconductor material 25 is single crystal/monocrystalline.

The second in situ doped epitaxial semiconductor material 25 is deposited to a thickness to fill at least a remainder of the space in the sacrificial gate material portion of the channel region opening 5. The second in situ doped epitaxial semiconductor material 25 may be deposited to a thickness than extends through the region of the channel region opening 5 that is present through the second spacer dielectric layer 12 into the portion of the channel region opening 5 that is present extending through the masking dielectric layer 13.

In some embodiments, the process sequence for forming the second in situ doped epitaxial semiconductor material 25 may include a deposition step that fills an entirety of the channel region opening 5 that is followed by an etch back process to recess the second in situ doped semiconductor material 25 to the height at which the drain region of the device is to be formed.

The dopant that dictates the conductivity type of the second in situ doped epitaxial semiconductor material 25 is introduced during the materials formation by in situ doping, and is present in a dopant concentration that can be referred to as being high. For example, the dopant concentration is selected to be at a level that is greater than the dopant concentration of the first in situ doped epitaxial semiconductor material 20, and therefore may be designated "n+" or "p+" dependent upon the conductivity type. In some embodiments, the doping concentration of the p-type, or n-type dopant, may range from $5\times10^{18}$ cm$^{-3}$ to $5\times10^{20}$ cm$^{-3}$. In one example, the doping concentration of the p-type or n-type dopant may be equal to $1\times10^{18}$ cm$^{-3}$.

In some embodiments, as depicted in FIGS. 13 and 14, the first conductivity type that provides the dopant type for the first in situ doped epitaxial semiconductor material 20 is p-type. In some other embodiments, as depicted in FIGS. 15 and 16, the first conductivity type that provides the dopant type for the first in situ doped epitaxial semiconductor material 20 is n-type.

In other embodiments, the dopant concentration gradually increases from the interface of the channel region with the source region layer 9 to the interface of the channel region with the drain region 35.

Still referring to FIG. 3, a dielectric cap 30 is formed atop the recessed second in situ doped epitaxial semiconductor material 25. The dielectric cap 30 may be composed of a nitride, oxide or oxynitride material, in which in some embodiments the material selected for the dielectric cap 30 may depend upon the etch selectivity requirements for removing the masking dielectric layer 13 in a later process step. In one example, the dielectric cap 30 may be composed of silicon nitride. The dielectric cap 30 may be deposited in the channel region opening 5 using a deposition process, such as chemical vapor deposition (CVD). The dielectric cap 30 may be planarized, e.g., planarized using chemical mechanical planarization, to provide that the upper surface of the dielectric cap 30 is coplanar with the upper surface of the masking dielectric layer 13.

Figure 4:
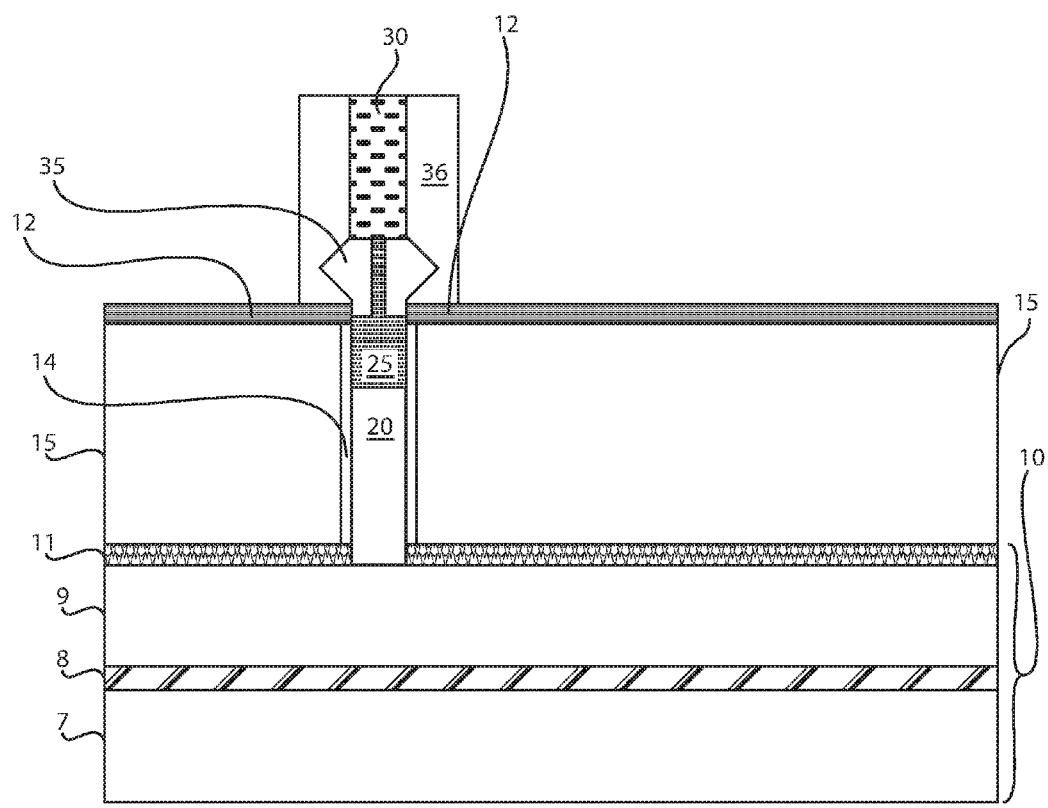
FIG. 4 is a side cross-sectional view depicting one embodiment of forming a drain region on the channel region of the device depicted in FIG. 3.

FIG. 4 depicts one embodiment of forming a drain region 35 on the channel region of the device depicted in FIG. 3. In some embodiments, forming the drain region 35 may begin with removing the masking dielectric layer 13 to expose the sidewalls of the second in situ doped epitaxial semiconductor material 25. The masking dielectric layer 13 may be removed using an etch process that is selective to at least the second in situ doped epitaxial semiconductor material 25, in which the etch process may also be selective to the second dielectric spacer layer 12. The term "selective" as used to describe a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater. The etch process for removing the masking dielectric layer 13 may include a wet chemical etch, plasma etch, reactive ion etch, and combinations thereof.

Following removal of the masking dielectric layer 13, the drain region 35 may be epitaxially formed on the exposed surfaces of the second in situ doped epitaxial semiconductor material 25. The epitaxial deposition process employed for the drain region 35 has been described above for epitaxially forming the source region layer 9. Because the epitaxial deposition process for forming the drain region 35 is similar to the epitaxial deposition process that forms the source region layer 9, the above described process limitations for epitaxially forming the source region layer 9 are applicable to the epitaxial deposition process for forming the drain region 35. For example, the drain region 35 may be composed of a silicon containing semiconductor, but other examples may include germanium containing semiconductors, as well as other type IV and type III-V semiconductor materials for the composition of the drain region 35. The drain region 35 is typically doped to a same conductivity type as the conductivity type of the source region layer 9. For example, if the source region layer 9 is doped to an n-type conductivity, as in the embodiments depicted in FIGS. 13 and 14, the drain region 35 is doped to an n-type conductivity; and if the source region layer 9 is doped to a p-type conductivity, as in the embodiments depicted in FIGS. 15 and 16, the drain region 35 is doped to an n-type conductivity. The dopant may be introduced to the drain region using in situ doping process, and is some embodiments using ion implantation. The dopant concentration of the drain region 35 may be at a high concentration relative to the first in situ doped semiconductor material 20 of the channel region, and therefore may be designated "n+" or "p+" dependent upon the conductivity type. For example, the concentration of dopant in the drain region 35 may range from $1 \times 10^{20}$ cm$^{-3}$ to $2 \times 10^{21}$ cm$^{-3}$.

It is noted that the epitaxial deposition process for forming the drain region 35 can be a selective deposition process that does not form semiconductor material on dielectric surfaces, such as the dielectric cap 30. In some embodiments, the drain region 35 may have a facetted geometry that may result from the epitaxial deposition process used in forming the drain region 35.

The stack of the source region layer 9, the channel region (i.e., first in situ doped epitaxial semiconductor material 20, and second in situ doped epitaxial semiconductor material 25), and the drain region in a direction of stacking perpendicular to the plane that is parrallel to the upper surface of the supporting substrate 7 may be referred to as "vertically orientated".

Figure 5:
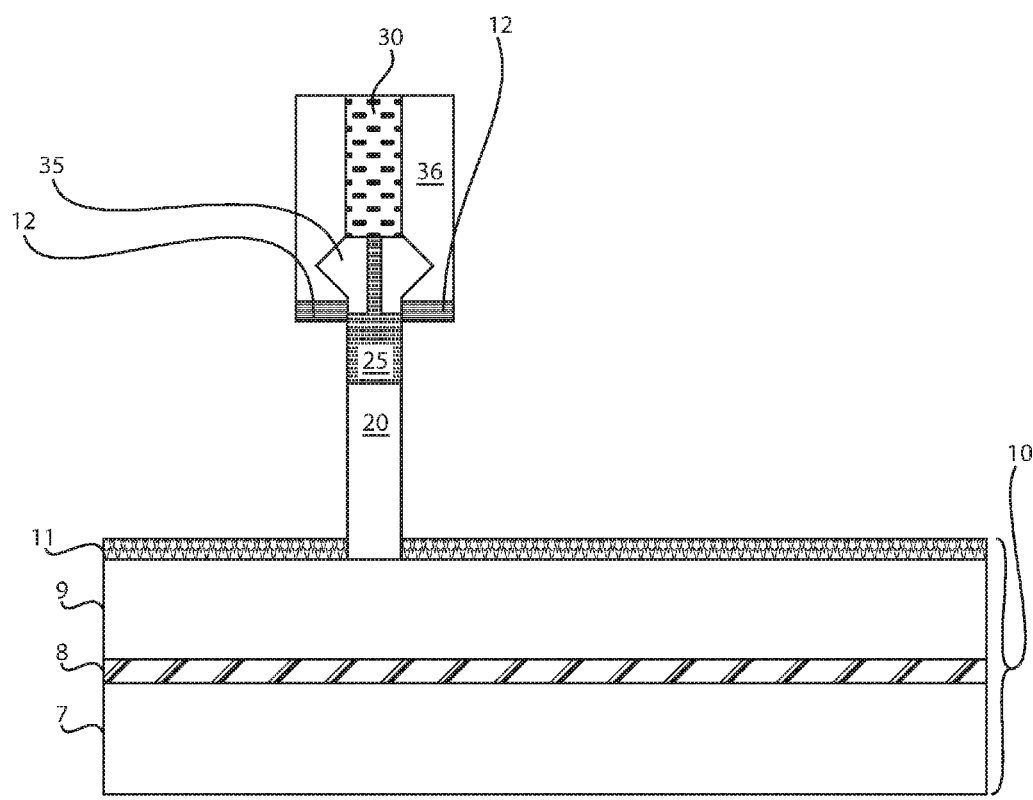
FIG. 5 is a side cross-sectional view depicting removing the sacrificial gate material to expose sidewalls of the channel region, in accordance with one embodiment of the present disclosure.

FIG. 5 depicts removing the sacrificial gate material 15 to expose sidewalls of the channel region. In some embodiments, removing the sacrificial gate material 15 may begin with forming a drain region enclosing spacer 36 on the sidewalls of the drain region 35, as depicted in FIG. 5. The drain region enclosing spacer 36 is formed of a dielectric material having a composition that allows for the sacrificial gate material 15 to be etched without damaging the channel region. For example, the drain region enclosing spacer 36 may be composed of a nitride, such as silicon nitride, when the inner spacer 14 is compose of an oxide, such as silicon oxide. It is noted that other compositions may be selected for the drain region enclosing spacer 36. The drain region enclosing spacer 36 may be formed using a deposition process, such as chemical vapor deposition, in combination with an etch back process, such as reactive ion etch.

Following formation of the drain region enclosing spacer 36, exposed portions of the second dielectric spacer layer 12 that are not covered by the drain region enclosing spacer may be removed using an etch process, such as a selective etch process, which can be anisotropic, e.g., reactive ion etch (RIE), or isotropic, e.g., wet chemical etch. The sacrificial gate material 15 may then be removed using an etch process that includes at least one isotropic phase to laterally etch the portions underlying the drain region 35. In some embodiments, a following isotropic etch process may be used to remove the inner spacers 14, in which the etch process for removing the inner spacer 14 is selective to at least the first and second in situ doped epitaxial semiconductor material 20, 25 of the channel region.

Figure 6:
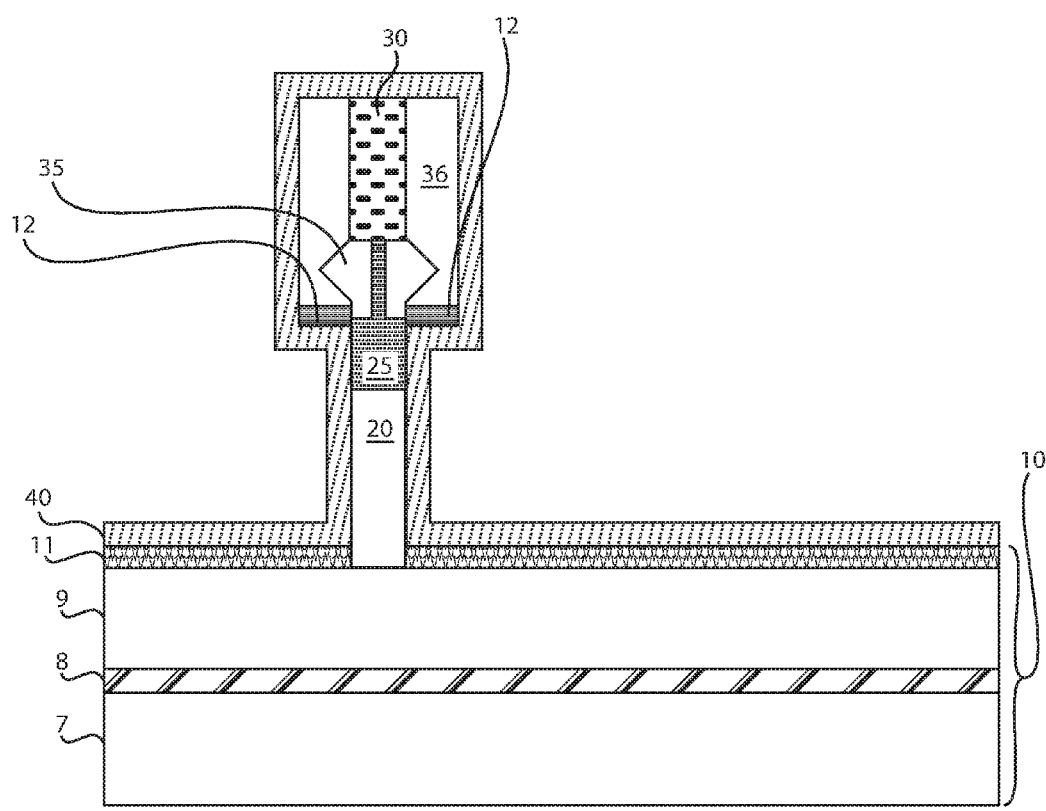
FIG. 6 is a side cross-sectional view depicting forming at least one first dielectric layer for the floating gate of the device, in accordance with one embodiment of the present disclosure.
Figure 7:
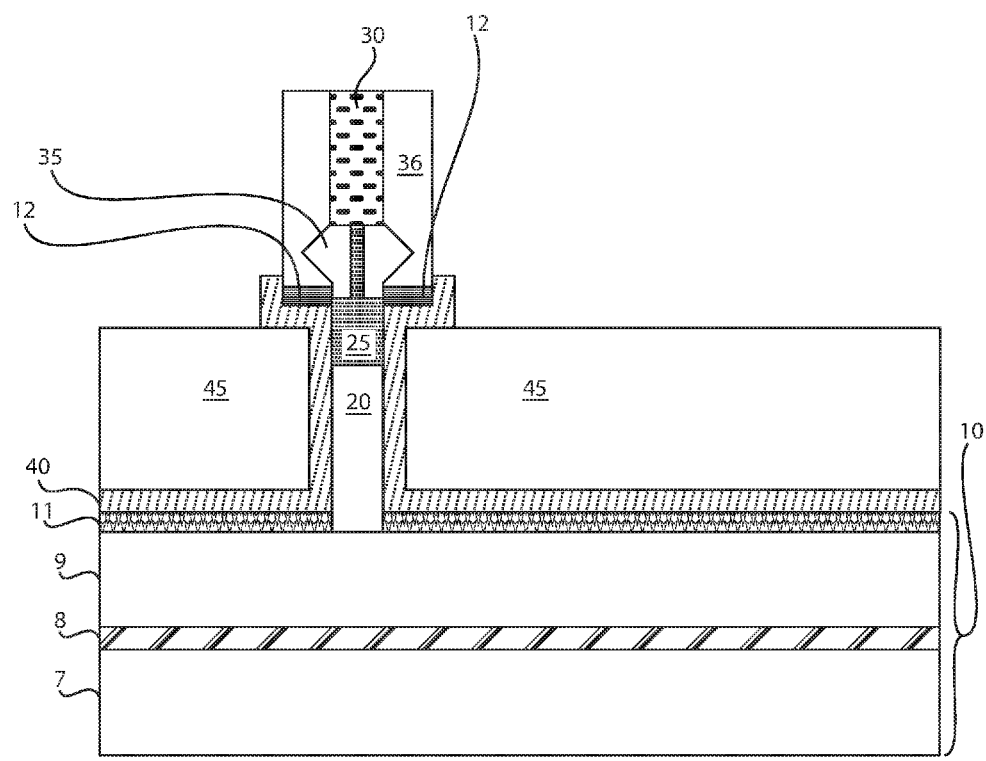
FIG. 7 is a side cross-sectional view depicting forming a conductive material layer for the floating gate of the device, in accordance with one embodiment of the present disclosure.
Figure 8:
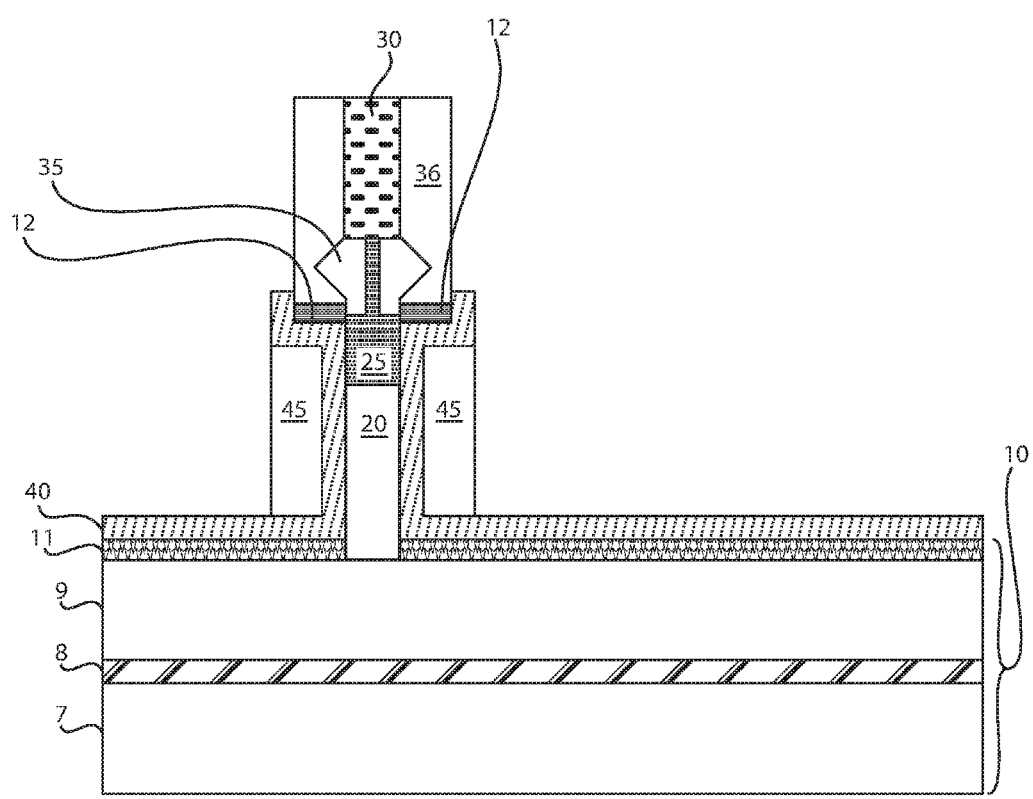
FIG. 8 is a side cross-sectional view depicting patterning the floating gate, in accordance with one embodiment of the present disclosure.

FIGS. 6-8 depict one embodiment of forming a floating gate of memory gate structure on the channel region of the device. FIG. 6 depicts one embodiment of forming at least one first dielectric layer 40 for the floating gate of the device. The at least one first dielectric layer 40, also referred to as gate dielectric of the floating gate structure, is first formed on at least the first and second in situ doped epitaxial semiconductor material 20, 25 that provides the channel region of the device. Typically, the at least one first dielectric layer 40 is formed using a conformal deposition process, which can also form the first dielectric layer 40 of the dielectric cap 30, the dielectric spacer enclosing the drain region 36, and the first dielectric spacer layer 11. The conformal deposition process may be a chemical vapor deposition process, such as plasma enhanced chemical vapor deposition (PECVD). The at least one first dielectric layer 40 may be composed of any dielectric material, such as an oxide, nitride or oxynitride material. In some embodiments, the at least one first dielectric layer 40 is a high-k dielectric material. As used herein, "high-k" denotes a dielectric material featuring a dielectric constant (k) higher than the dielectric constant of $SiO_2$ at room temperature. For example, the at least one first dielectric layer 40 may be composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the at least one gate dielectric include hafnium silicate, hafnium silicon oxynitride or combinations thereof. In one embodiment, the thickness of the at least one first dielectric layer 40 is greater than 0.8 nm. More typically, the at least one first dielectric layer 40 has a thickness ranging from about 1.0 nm to about 6.0 nm.

FIG. 7 depicts forming a first conductive material layer 45 for the floating gate of the device. The first conductive material layer 45 may be composed of any electrically conductive material, such as a metal or doped semiconductor. The first conductive material layer 45 is deposited on the at least one dielectric layer 40, and is processed to provide the gate conductor of the floating gate. In some examples, the conductive material layer 45 may be a doped semiconductor, such as an n-type doped polysilicon, which can be deposited using chemical vapor deposition methods. In other embodiments, the first conductive material layer 45 may be a metal, such as TiAlN, Ru, Pt, Mo, Co, TiAl, TaN, TiN, HfN, HfSi, Al, Cu, Pt, W, Ta, Au, Ag or combinations thereof, which can be deposited using physical vapor deposition (PVD) and/or chemical vapor deposition (CVD) methods. The first conductive material layer 45 may be deposited to a height that covers the entirety of the at least one dielectric layer 40 that is present on the first and second in situ doped epitaxial semiconductor material 20, 25 that provides the channel region of the device. Etch back methods may also be employed to ensure the proper height of the first conductive material layer 45.

FIG. 7 also depicts one embodiment of removing the portion of the at least one first dielectric layer 40 that is present on the dielectric spacer enclosing the spacer 36, which may be removed using an etch process, such as wet chemical etching or reactive ion etching. The etch process for removing the exposed portion of the first dielectric layer 40 may be selective to the dielectric spacer enclosing the spacer 36.

FIG. 8 depicts one embodiment of patterning the floating gate of the memory gate structure. More specifically, FIG. 8 depicts patterning the first conductive material layer 45 to pattern the gate conductor for the floating gate structure. In some embodiments, etching the first conductive material layer 45 may include an anisotropic etch process using the dielectric spacer that is enclosing the drain region 36, as well as the portion of the at least one first dielectric layer 40 that is present on the sidewalls of the spacer as an etch mask. An "anisotropic etch process" denotes a material removal process in which the etch rate in the direction normal to the surface to be etched is greater than in the direction parallel to the surface to be etched. One form of anisotropic etching that is suitable for etching the substrate 5 is reactive ion etching (RIE).

Figure 9:
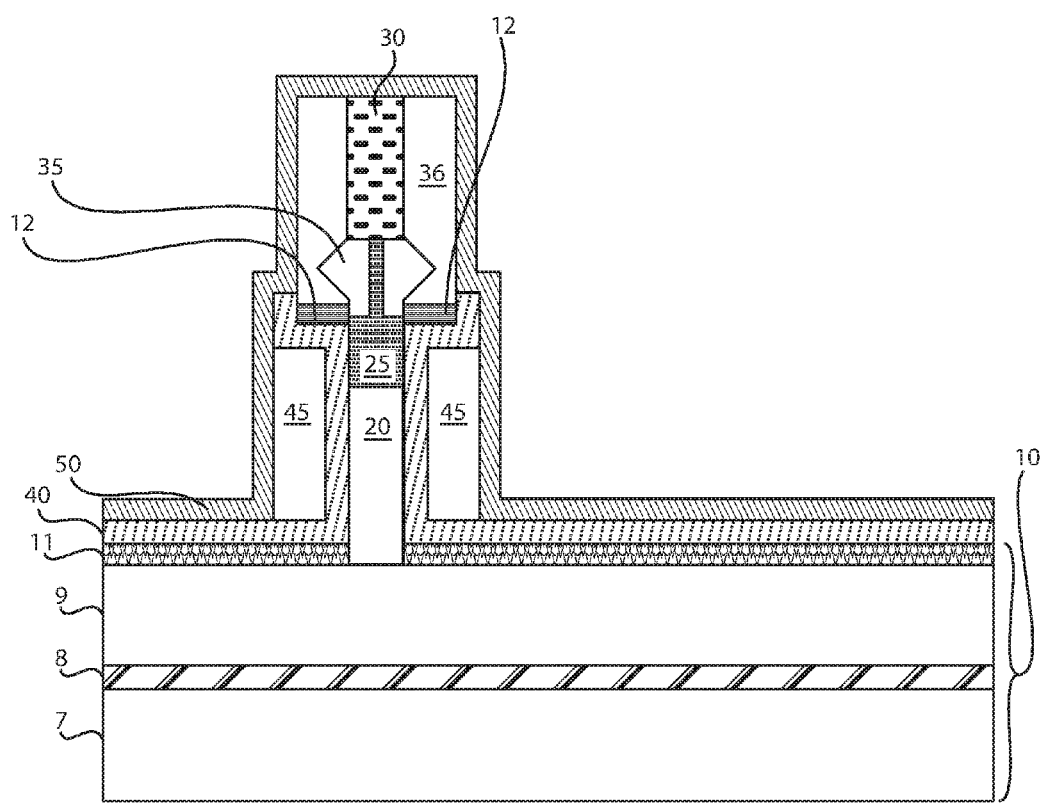
FIG. 9 is a side cross-sectional view depicting forming at least one second dielectric layer on the patterned floating gate for forming a control gate, in accordance with one embodiment of the present disclosure.
Figure 10:
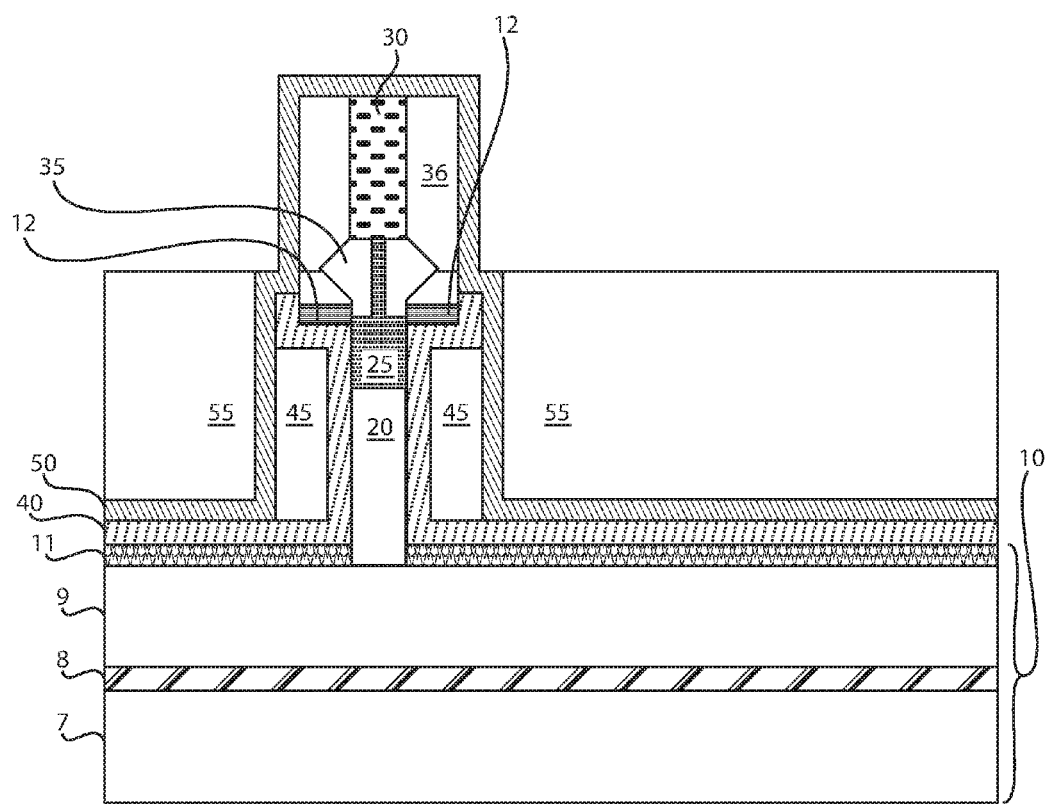
FIG. 10 is a side cross-sectional view depicting forming the conductive material for the control gate, in accordance with another embodiment of the present disclosure.
Figure 11:
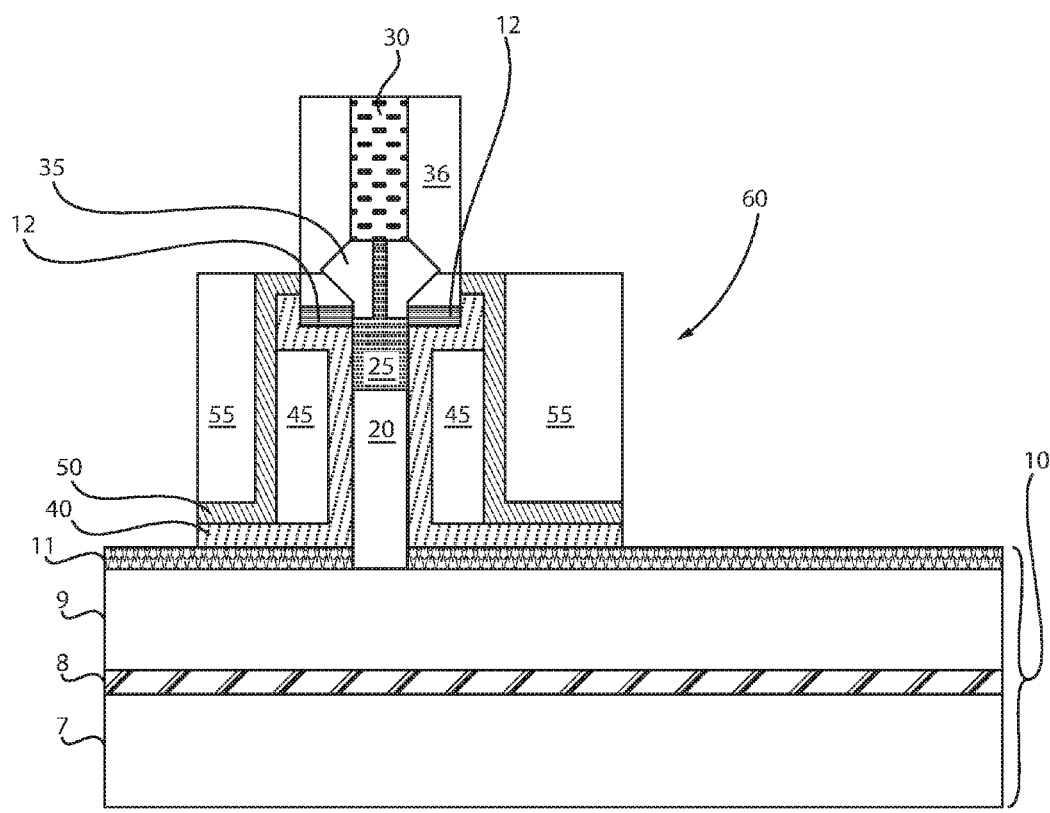
FIG. 11 is a side cross-sectional view depicting patterning the control gate, in accordance with one embodiment of the present disclosure.

FIGS. 9-11 depict one embodiment of forming the control gate structure portion of the memory gate structure. FIG. 9 depicts forming at least one second dielectric layer 50 on the patterned floating gate, in which the at least one second dielectric layer 50 provides the gate dielectric for forming a control gate structure. The second dielectric layer 50 is similar to the first dielectric layer 40 for the floating gate structure. Therefore, the above description of the composition and method of forming the first dielectric layer 40 is suitable for describing at least one embodiment of the second dielectric layer 50. The at least one second dielectric layer 50 is formed on the gate conductor portion of the floating gate structure, as well as the exposed portions of the at least one first dielectric layer 40, the dielectric spacer that in enclosing the drain region 36, and the dielectric cap 30.

FIG. 10 depicts one embodiment of forming the conductive material for the control gate of the memory gate structure. More specifically, FIG. 10 depicts one embodiment of forming a second conductive material 55 for the gate conductor of the control gate. The second conductive material layer 55 may be composed of any electrically conductive material, such as a metal or doped semiconductor. The second conductive material layer 55 is deposited on the at least one second dielectric layer 50. In some examples, the second conductive material layer 55 may be a doped semiconductor, such as an n-type doped polysilicon, which can be deposited using chemical vapor deposition methods. In other embodiments, the second conductive material layer 55 may be a metal, such as TiAlN, Ru, Pt, Mo, Co, TiAl, TaN, TiN, HfN, HfSi, Al, Cu, Pt, W, Ta, Au, Ag or combinations thereof, which can be deposited using physical vapor deposition (PVD) and/or chemical vapor deposition (CVD) methods. The second conductive material layer 55 may be deposited to a height that covers the entirety of the at least one second dielectric layer 50 that is present over the first and second in situ doped epitaxial semiconductor material 20, 25 that provides the channel region of the device. Etch back methods may also be employed to ensure the proper height of the second conductive material layer 55.

FIG. 11 depicts patterning the control gate structure 60. The control gate structure 60 may be patterned using photolithography and etch process steps. Specifically, a pattern for masking the control gate structure 60 is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. Following formation of the patterned photoresist (also referred to as a photoresist etch mask), the exposed portions the at least one second dielectric layer and the at least one second gate conductor are removed, wherein the portions of the second dielectric layer 50 and the at least one second gate conductor 55 remain to provide the control gate structure 60. The etch process may be anisotropic, such as reactive ion etch (RIE) process.

Figure 12:
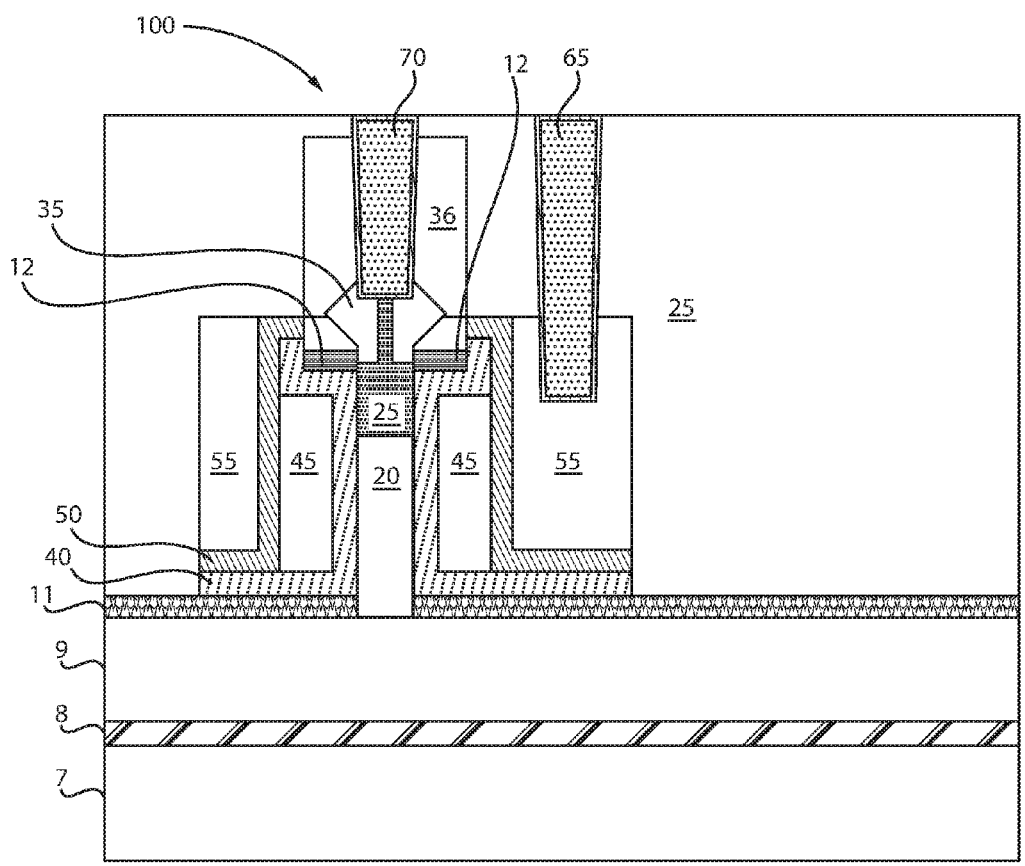
FIG. 12 is a side cross-sectional view depicting forming a contact to the drain region of the device and forming a contact to the control gate of the device depicted in FIG. 11, in accordance with one embodiment of the present disclosure.

FIG. 12 depicts forming a contact 70 to the drain region 35 of the device, and forming a contact 65 to the control gate 55 (55 is part of the control gate 60) of the device depicted in FIG. 11. Forming the contacts may begin with depositing an inter-layer dielectric (ILD) material 75. The inter-layer dielectric (ILD) material layer 75 may be formed over the entirety of the structure depicted in FIG. 11. Openings may be formed in the inter-layer dielectric (ILD) material 75 using photolithography and etch method steps. For example, a pattern is produced by applying a photoresist to the surface to be etched; exposing the photoresist to a pattern of radiation; and then developing the pattern into the photoresist utilizing conventional resist developer. Once the patterning of the photoresist is completed, the sections of the dielectric layer covered by the photoresist are protected while the exposed regions are removed using a selective etching process that removes the unprotected regions. The etch process for forming the openings in the inter-layer dielectric (ILD) material 75 may be an anisotropic etch, such as reactive ion etch (RIE), laser etching, and/or plasma etching. The openings are formed to the drain region 35 and the control gate 60. Forming the opening to the drain region 35 includes removing the dielectric cap 30. The openings may be filled with an electrically conductive material, such as a metal or a doped semiconductor, to provide the contacts 65, 70. The contact 70 to the drain region 35 is to a bitline of the device, and the contact 65 to the control gate 60 is to a wordine of the device.

FIG. 13 depicts forming a memory device 100 including a floating gate 40, 45 and a p-type doped channel 20, 25 that is formed in accordance with the method described with reference to FIGS. 1-12 in combination with a vertical transistor 110. The vertical transistor 110 may be a vertical FinFET, in which a fin structure provides the channel region 90 of the device. The vertical transistor 110 may be separated from the memory device 100 by an isolation region. The source region 80 and the drain region 85 of the vertical transistor 110 that is depicted in FIG. 13 may have a same conductivity type as the source region layer 9 and the drain region 35 of the memory device. The channel region 90 of the vertical transistor 110 may have a conductivity type that is the same as the conductivity type of the channel region 20, 25 of the memory device 100. But, in some embodiments, the channel region of the channel region 90 of the vertical transistor has a substantially uniform dopant concentration that provides the n-type or p-type conductivity at concentrations the same as or lower than the dopant concentration of the first in situ doped epitaxial semiconductor material 20 of the channel region of the memory device 100. For example, the dopant concentration of the channel region of the vertical transistor 110 may range from $1 \times 10^{17}$ cm$^{-3}$ to $5 \times 10^{18}$ cm$^{-3}$. In other embodiments, the channel region 20 has doping present in a concentration ranging from $5 \times 10^{17}$ cm$^{-3}$ to $5 \times 10^{18}$ cm$^{-3}$.

The vertical transistor 110 and the memory device 100 may be formed on the same substrate structures in which some components of the vertical transistor 110 are formed simultaneously with components of the memory device 100. For example, the source region layer 9 of the memory device may also be provided by a material layer that also provides the source region 80 of the vertical transistor 110. In this example, the drain region of the memory device 100 and the source region of the vertical transistor 110 are composed of a same material, same conductivity type, and same dopant concentration for the dopant that dictates the conductivity type of the material that provides the source regions.

Block masks may be used to independently process one region of the substrate, e.g., the portion of the substrate containing the memory device 100, while a second region of the substrate is not being processed, e.g., the portion of the substrate containing the vertical transistor 110.

For example, the channel region for the vertical transistor 110 is different from the channel of the memory device 100. In this scenario, block masks may be used to independent process the different channel regions for the different devices.

The gate structure of the vertical transistor 110 is also different from the gate structure of the memory device 100. The vertical transistor 110 includes a functional gate structure 95 composed of at least one gate dielectric 96 and at least one gate conductor 98. In the embodiment, depicted in FIG. 13, the at least one gate dielectric 96 may be a high-k gate dielectric, such as hafnium oxide ($HfO_2$). Other high-k gate dielectric compositions have been provided above in the description of the at least one first dielectric 40 and the at least one second dielectric layer 55 for the floating and control gate of the gate structure of the memory device 100. The at least one gate dielectric 96 may be formed using chemical vapor deposition (CVD).

In some embodiments, a work function metal layer 97 may be present between the at least one gate dielectric 96, and the gate conductor 98. The work function metal may be selected to provide a p-type work function metal layer and an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, HfSi, or combinations thereof. The work function metal layer 97 may be deposited using physical vapor deposition (PVD), such as plating, electroplating, electroless plating, sputtering and combinations thereof.

The gate conductor 98 for the vertical transistor 110 may be formed on the work function metal layer 97. In various embodiments, the gate conductor 98 is a metal, where the metal may be tungsten (W), tungsten nitride (WN) or combinations thereof. In one or more embodiments, the gate conductor 98 is tungsten (W). The gate conductor 98 may be deposited by CVD, e.g., plasma enhanced chemical vapor deposition (PECVD).

In some embodiments, the drain region 35 of the memory device 100 and the drain region 85 of the vertical transistor 110 can be formed using a same epitaxial deposition process, in which the drain regions 35 are composed of a same material, same conductivity type, and same dopant concentration for the dopant that dictates the conductivity type of the material that provides the drain regions 35, 85.

In the embodiment depicted in FIG. 13, the source and drain regions 9, 80, 35, 85 of the memory device 100 and the vertical transistor 110 may be n-type; and the channel regions 20, 25, 90 of the memory device 100 and the vertical transistor 110 may be p-type. The devices depicted in FIG. 14 may be referred to as p-type channel devices. The embodiment depicted in FIG. 14 is similar to the embodiment depicted in FIG. 13 with the exception that the devices depicted in FIG. 14 have opposite conductivity types as the devices depicted in FIG. 13. For example, the source and drain regions 9, 80, 35, 85 of the memory device 100 and the vertical transistor 110 in FIG. 14 may be p-type; and the channel regions 20, 25, 90 of the memory device 100 and the vertical transistor 110 in FIG. 14 may be n-type. The devices depicted in FIG. 14 may be referred to as n-type channel devices.

In the embodiments depicted in FIGS. 13 and 14, the doping concentration is modulated in the channel region 20, 25 of the memory device 100 to increase the hot carrier injection efficiency to increase the avalanche multiplication, and thereby reduce the operating voltage. For example, the dopant concentration in the portion of the channel region of the memory device 100 closest to the drain region 35, i.e., the second in situ doped epitaxial semiconductor material 25, is greater than the dopant concentration in the remainder of the channel. In some embodiments, the modulated doping concentration should increase the program efficiency of the cell.

It is noted that the modulated doping concentration in the channel region 20, 25 of the memory device 100 can be optional. In some embodiments, a memory device 100 can be provided using the process flow described with reference to FIGS. 1-12, in which the channel region 20' has a uniform doping concentration, as depicted in FIG. 15. In this example, the first in situ doped epitaxial semiconductor material that is described with reference to FIG. 2 fills an entirety of the channel opening 5, and the second in situ doped epitaxial semiconductor material is omitted. The channel region 20' for the memory device 100 depicted in FIG. 15 may be doped to an n-type or p-type conductivity and has a uniform dopant concentration ranging from $5 \times 10^{17}$ cm$^{-3}$ to $5 \times 10^{18}$ cm$^{-3}$. In one example, the doping concentration of the p-type or n-type dopant in the channel region 20' may be equal to $1 \times 10^{18}$ cm$^{-3}$. The remainder of the memory device 100, as well as the vertical transistor 110, that is depicted in FIG. 15 is described above with reference to FIGS. 1-14, in which components having the same reference numbers are the same.

FIG. 16 depicts another embodiment of the present disclosure including a memory device 100 including a memory gate structure having a floating gate in combination with a drain region 35 comprised of a narrow band gap semiconductor material in comparison to the channel region 20, 25 of the device. The term "band gap" refers to the energy difference between the top of the valence band and the bottom of the conduction band of a semiconductor material. For example, the drain region 35 of the memory device 100 depicted in FIG. 16 may be composed of a germanium containing material, e.g., silicon germanium (SiGe), while the channel region 20, 25 of the memory device 110 may be composed of silicon (Si). The source region layer 9 of the memory device 100 may also be composed of a material having a greater band gap than the drain region 35. For example, the source region layer 9 may be composed of silicon (Si). The vertical device 110 depicted in FIG. 16 may have the same semiconductor materials for the drain and channel regions 85, 90 as the materials used for the drain region 35 and channel region 20, 25 of the memory device 100. In other embodiments, the vertical device 110 depicted in FIG. 16 may have different semiconductor materials for the drain and channel regions 85, 90 as the materials used for the drain region 35 and channel region 20, 25 of the memory device 100. The remainder of the memory device 100 that is depicted in FIG. 16 is described above with reference to FIGS. 1-15. The vertical transistor 110 depicted in FIG. 16 is similar to the vertical transistor 110 that has been described above with reference to FIGS. 1-15.

Having described preferred embodiments of vertical transistor fabrication and devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transistor memory device comprising:
 a source region and a drain region of a first conductivity type;
 an epitaxial channel region present between the source region and the drain region, wherein the source region, drain region and epitaxial channel region are orientated vertically, and the epitaxial channel region comprises a modulated dopant concentration having a higher concentration at an interface between the epitaxial channel region and the drain region; and
 a memory gate structure present on the epitaxial channel region including a floating gate and a control gate.

2. The vertical transistor memory device of claim 1, wherein a first dopant concentration of the modulated dopant concentration in the epitaxial channel region ranges from $1\times10^{18}$ cm$^{-3}$ to $5\times10^{18}$ cm$^{-3}$.

3. The vertical transistor memory device of claim 1, wherein a second dopant concentration of the modulated dopant concentration in the epitaxial channel region ranges from $1\times10^{19}$ cm$^{-3}$ to $1\times10^{20}$ cm$^{-3}$.

4. A vertical transistor memory device comprising:
 a source region and a drain region of a first conductivity type;
 an epitaxial channel region present between the source region and the drain region, wherein the source region, drain region and epitaxial channel region are orientated vertically, and a semiconductor material of the drain region has a smaller energy band gap than the epitaxial channel region; and
 a memory gate structure present on the epitaxial channel region including a floating gate and a control gate.

5. The vertical transistor memory device of claim 4, wherein a dopant concentration in the epitaxial channel region is uniform.

6. The vertical transistor memory device of claim 5, wherein the source region comprises a silicon containing material, the epitaxial channel region comprises a silicon containing material, and the drain region comprises a germanium containing material.

* * * * *